(12) United States Patent
Bayoumi et al.

(10) Patent No.: US 11,550,000 B2
(45) Date of Patent: Jan. 10, 2023

(54) SMART GRID DISTRIBUTION TRANSFORMER

(71) Applicant: HITACHI ENERGY SWITZERLAND AG, Baden (CH)

(72) Inventors: Deia Bayoumi, Cary, NC (US); Muge Ozerten, Raleigh, NC (US); Alberto Prieto, Cary, NC (US); Abdelghafour Bouaicha, Cary, NC (US); Carlo Cereda, Caravaggio (IT); Claire Pitois, Sundyberg (SE)

(73) Assignee: HITACHI ENERGY SWITZERLAND AG, Baden (CH)

( * ) Notice: Subject to any disclaimer, the term of this patent is extended or adjusted under 35 U.S.C. 154(b) by 564 days.

(21) Appl. No.: 16/492,542

(22) PCT Filed: Mar. 10, 2018

(86) PCT No.: PCT/US2018/021885
§ 371 (c)(1),
(2) Date: Sep. 9, 2019

(87) PCT Pub. No.: WO2018/165636
PCT Pub. Date: Sep. 13, 2018

(65) Prior Publication Data
US 2020/0393521 A1 Dec. 17, 2020

Related U.S. Application Data

(60) Provisional application No. 62/470,147, filed on Mar. 10, 2017.

(51) Int. Cl.
*G01R 31/62* (2020.01)
*G01D 21/02* (2006.01)
(Continued)

(52) U.S. Cl.
CPC .......... *G01R 31/62* (2020.01); *G01D 21/02* (2013.01); *G01R 15/181* (2013.01);
(Continued)

(58) Field of Classification Search
CPC ...... G01R 31/62; G01R 15/181; G01D 21/02; H01F 27/402; H01F 41/00; H01F 27/12;
(Continued)

(56) References Cited

U.S. PATENT DOCUMENTS 6,420,879 B2 * 7/2002 Cooke ................ G01R 31/1227
324/501
8,707,767 B2 4/2014 Herz et al.
(Continued)

FOREIGN PATENT DOCUMENTS

EP 1470948 A1 10/2004
EP 2916464 A1 9/2015
(Continued)

OTHER PUBLICATIONS

Avinash et al., Remote Condition Monitoring System for Distribution Transformer, 18 Nat'l Power Sys. Conf. (Dec. 18-20, 2014) (available at https://ieeexplore.ieee.org/document/7103848, last accessed Apr. 29, 2022) (Year: 2014).*
(Continued)

*Primary Examiner* — Tung X Nguyen
*Assistant Examiner* — Robert P Alejnikov, Jr.
(74) *Attorney, Agent, or Firm* — Sage Patent Group

(57) ABSTRACT

A system for distribution transformer monitoring may comprise a distribution transformer that includes a transformer fluid tank, a monitoring unit that includes a plurality of sensors, wherein the monitoring unit is coupled to the distribution transformer, and wherein the plurality of sensors comprises a fluid sensor that includes a sensor probe that extends out of the monitoring unit into the transformer fluid
(Continued)

tank of the distribution transformer, and a communication unit coupled to the distribution transformer and communicatively coupled to the monitoring unit. The monitoring unit may further comprises a sensor module to receive sensor data from the plurality of sensors, a storage module to store the sensor data in an internal data storage device of the monitoring unit, an analysis module to analyze the sensor data to determine generated data, and a communication module to communicate the sensor data or the generated data to a remote computing device.

16 Claims, 13 Drawing Sheets

(51) Int. Cl.
*G01R 15/18* (2006.01)
*H01F 27/40* (2006.01)
*H01F 41/00* (2006.01)
*H01F 27/12* (2006.01)

(52) U.S. Cl.
CPC ........... *H01F 27/402* (2013.01); *H01F 41/00* (2013.01); *H01F 27/12* (2013.01); *H01F 2027/406* (2013.01)

(58) Field of Classification Search
CPC ........ H01F 2027/406; H01F 2027/404; H02H 7/042; H02H 5/06; H02H 5/086
USPC ........................................................ 324/547
See application file for complete search history.

(56) References Cited

U.S. PATENT DOCUMENTS

| | | | |
|---|---|---|---|
| 9,128,477 B2* | 9/2015 | Stenestam | G05B 19/0428 |
| 2012/0092114 A1 | 4/2012 | Matthews | |
| 2015/0253362 A1* | 9/2015 | Louzir | G01D 4/002 |
| | | | 324/126 |
| 2016/0131504 A1* | 5/2016 | Farrokhian | G01R 31/62 |
| | | | 324/127 |
| 2016/0202103 A1* | 7/2016 | Heinonen | G01F 23/242 |
| | | | 73/304 C |
| 2017/0011612 A1* | 1/2017 | Jain | H01F 27/402 |

FOREIGN PATENT DOCUMENTS

| | | |
|---|---|---|
| WO | WO 2010/077078 A2 | 7/2010 |
| WO | WO 2014/107984 A1 | 7/2014 |

OTHER PUBLICATIONS

PCT International Search Report and Written Opinion for PCT/US2018/021885, dated May 15, 2018, 9 pages.
Nelson et al., Remote Condition Monitoring System for Distribution Transformer, Eighteenth National Power Systems Conference (NPSC), pp. 1-5, 2014.
Partial Supplementary European Search Report, EP18764450.5, dated Dec. 17, 2020, 17 pages.
Extended European Search Report, EP18764450.5, dated Apr. 8, 2021, 18 pages.
Examination Report, Indian Patent Office, IN201917040855, dated Feb. 17, 2021, 6 pages.
International Preliminary Report on Patentability, PCT/US2018/021885, dated Sep. 10, 2019, 7 pages.

* cited by examiner

SMART GRID DISTRIBUTION TRANSFORMER

CROSS-REFERENCE TO RELATED CASE

This application is a national stage entry made under 35 U.S.C. § 371 of PCT International Stage Patent Application No. PCT/US2018/021885, filed Mar. 10, 2018, which claims priority under 35 U.S.C. § 119(e) to U.S. Provisional Patent Application No. 62/470,147, filed Mar. 10, 2017, the entire disclosures of which are incorporated by reference herein.

BACKGROUND

Distribution transformers provide the last voltage transformation in the electrical power distribution system, stepping down the voltage used in the transmission line to the voltage used by the consumer. For example, a distribution transformer may step down transmission line voltage to household voltage levels for distribution to one or more residences. Distribution transformers are typically much smaller than power transformers, and thus may be pole-mounted to a utility pole or pad-mounted on the ground. Typical distribution transformers include internal components immersed in oil for insulation and cooling.

SUMMARY

According to one aspect, a system for distribution transformer monitoring is disclosed. The system includes a distribution transformer, a monitoring unit, and a communication unit. The distribution transformer includes a transformer fluid tank. The monitoring unit includes a plurality of sensors, and is coupled to the distribution transformer. The plurality of sensors includes a fluid sensor that includes a sensor probe that extends out of the monitoring unit into the transformer fluid tank of the distribution transformer. The monitoring unit further includes a sensor module to receive sensor data from the plurality of sensors, wherein the sensor data includes (i) voltage or current data from a voltage or current sensor, wherein the voltage or current data is indicative of voltage or current output by the distribution transformer, and (ii) fluid tank data from the fluid sensor, wherein the fluid tank data is indicative of a characteristic within the transformer fluid tank; a storage module to store the sensor data in an internal data storage device of the monitoring unit; an analysis module to analyze the sensor data to determine generated data; and a communication module to communicate the sensor data or the generated data to a remote computing device. The communication unit is coupled to the distribution transformer and communicatively coupled to the monitoring unit.

In some embodiments, the communication unit may include an enclosure separate from the monitoring unit, and to communicate the sensor data or the generated data may include to communicate with the remote computing device using the communication unit. In some embodiments, to communicate the sensor data or the generated data to the remote computing device may include to communicate an alert to the remote computing device based on the sensor data or the generated data. In some embodiments, the communication unit further includes an identification module to transmit identification data indicative of the distribution transformer to a remote computing device. In some embodiments, to transmit the identification data indicative of the distribution transformer may include to transmit the identification data with a radio frequency identifier (RFID) system of the communication unit.

In some embodiments the fluid sensor may be a fluid temperature sensor, an insulating fluid level sensor, a pressure sensor, a water content sensor, or a dissolved gas sensor. In some embodiments, to analyze the sensor data to determine the generated data may include to analyze the sensor data to determine estimated lifetime consumption data. In some embodiments, to analyze the sensor data to determine the generated data may include to analyze the sensor data to determine diagnostics data.

In some embodiments, the distribution transformer may include a transformer terminal, and the voltage or current sensor may be coupled to the transformer terminal to measure the voltage or current output by the distribution transformer. In some embodiments, the monitoring unit may be powered by the transformer terminal.

According to another aspect, a method for distribution transformer monitoring is disclosed. The method includes receiving, by a monitoring unit, sensor data from a plurality of sensors; storing, by the monitoring unit, the sensor data in an internal data storage device of the monitoring unit; analyzing, by the monitoring unit, the sensor data to determine generated data; and communicating, by the monitoring unit, the sensor data or the generated data to a remote computing device. Receiving the sensor data includes receiving voltage or current data from a voltage or current sensor, wherein the voltage or current data is indicative of voltage or current output by a distribution transformer; and receiving fluid tank data from a fluid sensor, wherein the fluid tank data is indicative of a characteristic within a transformer fluid tank of the distribution transformer.

In some embodiments, communicating the sensor data or the generated data to the remote computing device may include communicating an alert to the remote computing device based on the sensor data or the generated data. In some embodiments, communicating the sensor data or the generated data may include communicating with the remote computing device using a communication unit. The communication unit includes an enclosure separate from the monitoring unit, and the communication unit is communicatively coupled to the monitoring unit. In some embodiments, the enclosure of the communication unit may be nonmetallic. In some embodiments, the method further includes transmitting, by the communication unit, identification data indicative of the distribution transformer to a remote computing device. In some embodiments, transmitting the identification data indicative of the distribution transformer may include transmitting the identification data with a radio frequency identifier (RFID) system of the communication unit.

In some embodiments, receiving the fluid tank data from the fluid sensor may include receiving fluid tank data from a fluid temperature sensor, an insulating fluid level sensor, a pressure sensor, a water content sensor, or a dissolved gas sensor. In some embodiments, analyzing the sensor data to determine the generated data may include analyzing the sensor data to determine estimated lifetime consumption data. In some embodiments, analyzing the sensor data to determine the generated data may include analyzing the sensor data to determine diagnostics data.

In some embodiments, receiving the voltage or current data from the voltage or current sensor may include receiving voltage or current data from a voltage or current sensor coupled to a transformer terminal of the distribution transformer. In some embodiments, the monitoring unit may be powered by the transformer terminal.

According to another aspect, a method for assembling a distribution transformer system is disclosed. The method includes forming an opening in a wall of a transformer fluid tank of a distribution transformer; attaching a flange to the wall of the transformer fluid tank, wherein the flange surrounds the opening; inserting a sensor probe array of a monitoring unit into the transformer fluid tank through the opening in response to attaching the flange, wherein the sensor probe array includes a sensor probe to measure a characteristic within the transformer fluid tank; and attaching the monitoring unit to the flange in response to inserting the sensor probe array.

In some embodiments, forming the opening may include cutting an opening in an existing transformer fluid tank. In some embodiments, attaching the flange may include welding the flange to the wall. In some embodiments, attaching the monitoring unit may include bolting the monitoring unit to the flange.

BRIEF DESCRIPTION OF THE DRAWINGS

The concepts described herein are illustrated by way of example and not by way of limitation in the accompanying drawings. For simplicity and clarity of illustration, elements illustrated in the accompanying drawings are not necessarily drawn to scale. Where considered appropriate, reference labels have been repeated among the accompanying drawings to indicate corresponding or analogous elements. The detailed description refers to the accompanying drawings, in which.

DETAILED DESCRIPTION OF THE DRAWINGS

Figure 1:
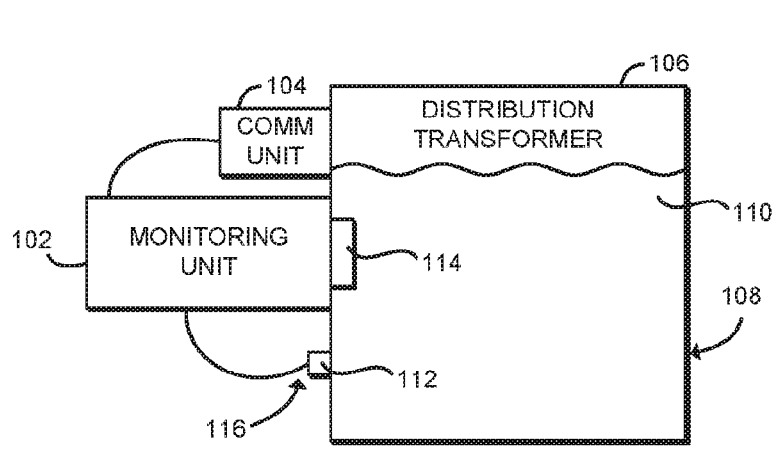
FIG. 1 is a simplified block diagram of at least one embodiment of a system for a smart grid distribution transformer monitoring.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one of A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, in an illustrative embodiment, a system 100 for smart grid distribution transformer monitoring includes a monitoring unit 102, a communication unit 104, and a distribution transformer 106. The distribution transformer 106 includes a tank wall 108 that at least partially defines a tank that contains transformer insulating fluid 110. The transformer insulating fluid 110 is a nonconductive, insulating fluid that insulates and cools the internal components of the distribution transformer 106. The transformer insulating fluid 110 may be a dielectric fluid and, by way of non-limiting example, a mineral oil, an ester-based fluid, or a similar material. The distribution transformer 106 also includes one or more low-voltage bushings 112, through which the low-voltage output of the distribution transformer 106 is accessible. As shown, the monitoring unit 102 includes a sensor probe array 114 that is inserted through the tank wall 108 into the insulating fluid 110. The monitoring unit 102 is also connected to the low-voltage bushings 112 using a voltage/current sensor connection 116. Although illustrated as attaching to the tank wall 108, it should be understood that in some embodiments the monitoring unit 102 may attach to a different part of the tank, such as the cover.

In use, as described further below, the monitoring unit 102 receives sensor data from multiple sensors, including voltage and current sensor data as well as sensor data indicative of characteristics of the insulating fluid 110. The monitoring unit 102 may analyze the sensor data to determine generated data. The communication unit 104 may transmit the sensor data, the generated data, and/or identification data related to the distribution transformer 106 to one or more remote devices, for example via wireless networking, RFID, or other techniques. Thus, the system 100 may provide continual monitoring of the condition of the distribution transformer 106, allowing for improved knowledge of network status. Additionally, the system 100 may provide simplified and robust assembly by requiring only two devices (the monitoring unit 102 and the communication unit 104) to be installed in the distribution transformer 106. As compared to individually installing and wiring each sensor, the system 100 may provide lower installation cost with higher reliability. Additionally, the system 100 may be retrofit to existing distribution transformers and may be easily replaced during service. Also, the system 100 may draw power from the low voltage bushings or other terminals of the distribution transformer 106, and thus may be used in locations without an external power supply, such as electrical substations.

Figure 2:
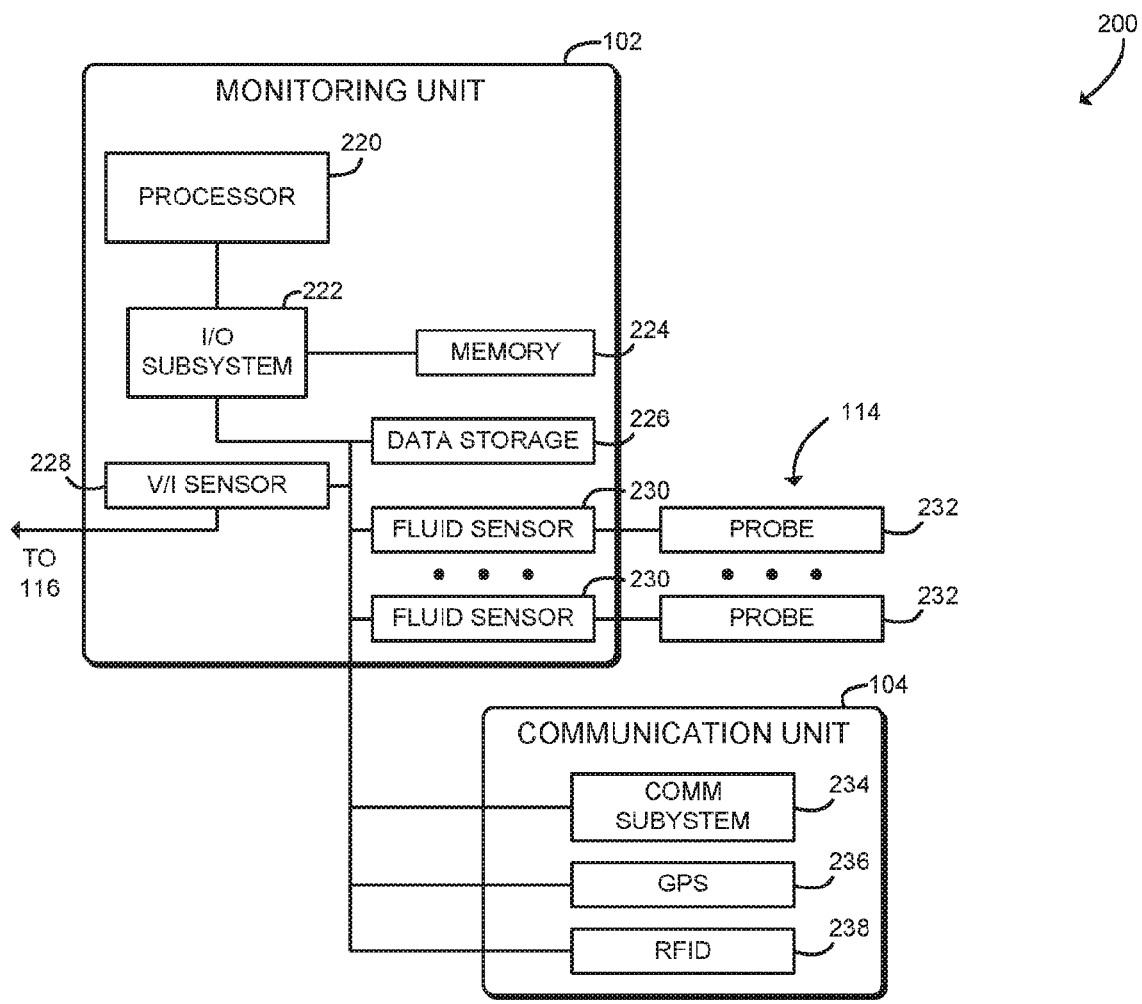
FIG. 2 is a simplified block diagram of at least one embodiment of a monitoring unit and a communication unit of the system of FIG. 1.
Figure 3:
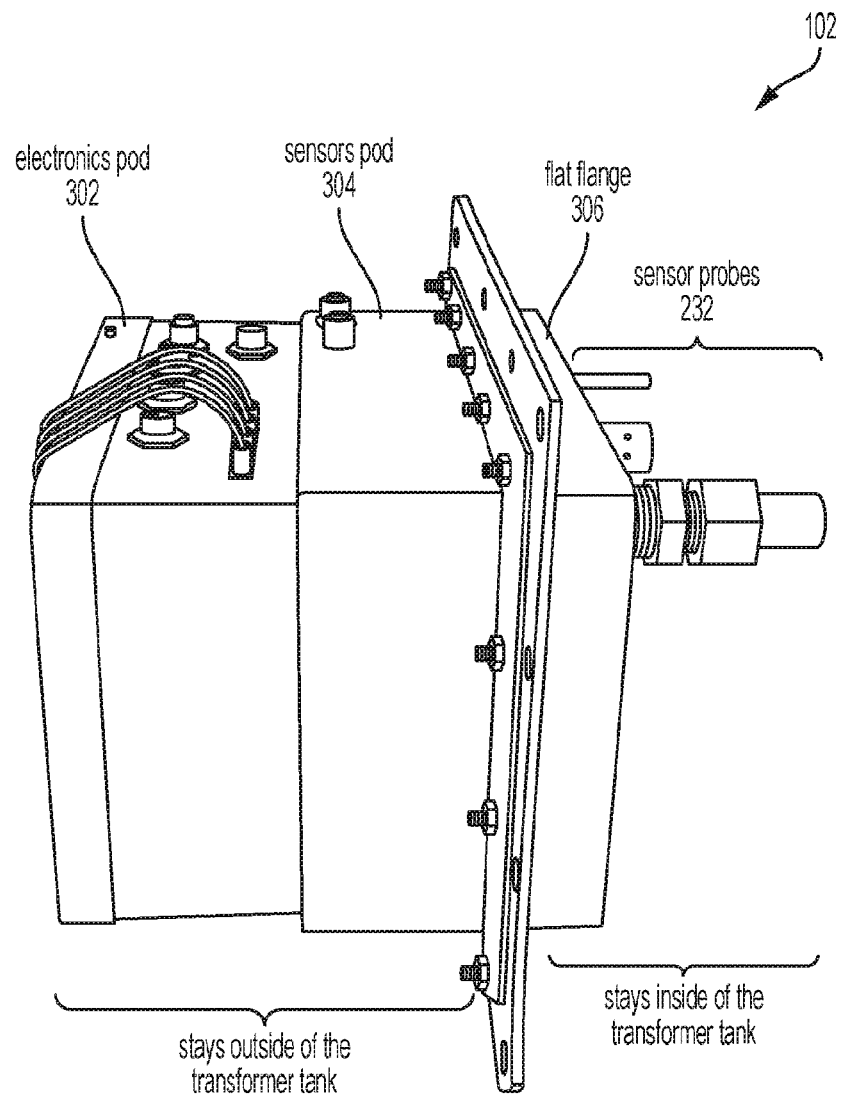
FIG. 3 is a perspective view of at least one embodiment of the monitoring unit of FIGS. 1 and 2.
Figure 4:
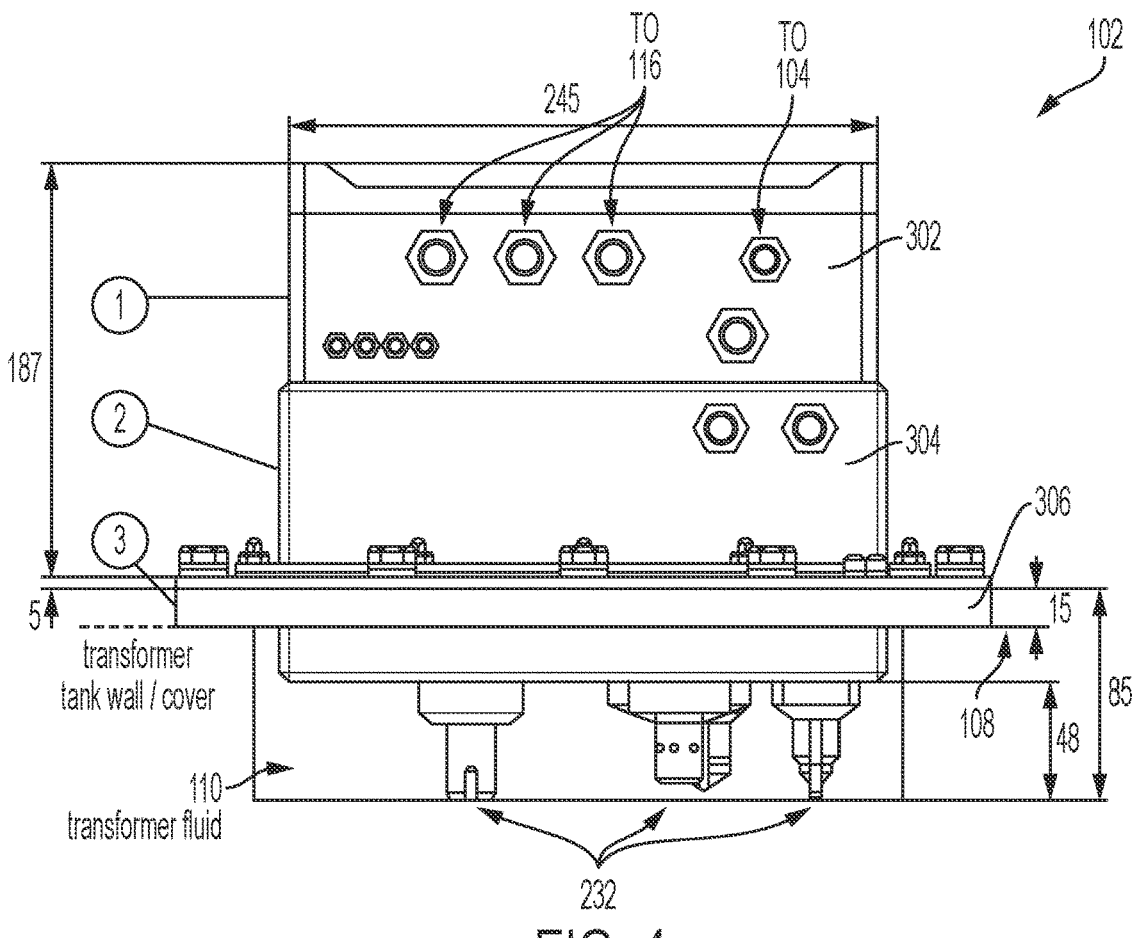
FIG. 4 is a bottom view of at least one embodiment of the monitoring unit of FIGS. 1-3.

Referring now to FIG. 2, diagram 200 illustrates the monitoring unit 102 and the communication unit 104. The monitoring unit 102 may be embodied as any type of computation or computer device capable of performing the functions described herein, including, without limitation, a computer, an embedded system, an industrial controller, a multiprocessor system, a server, a rack-mounted server, a network appliance, a distributed computing system, a processor-based system, and/or a consumer electronic device. As shown in FIG. 2, the monitoring unit 102 illustratively includes a processor 220, an input/output subsystem 222, a memory 224, and a data storage device 226. Of course, the monitoring unit 102 may include other or additional components, such as those commonly found in an industrial controller (e.g., various input/output devices), in other embodiments. Additionally, in some embodiments, one or more of the illustrative components may be incorporated in, or otherwise form a portion of, another component. For example, the memory 224, or portions thereof, may be incorporated in the processor 220 in some embodiments.

The processor 220 may be embodied as any type of processor capable of performing the functions described herein. The processor 220 may be embodied as a single or multi-core processor(s), digital signal processor, microcontroller, or other processor or processing/controlling circuit. Similarly, the memory 224 may be embodied as any type of volatile or non-volatile memory or data storage capable of performing the functions described herein. In operation, the memory 224 may store various data and software used during operation of the monitoring unit 102 such as operating systems, applications, programs, libraries, and drivers. The memory 224 is communicatively coupled to the processor 220 via the I/O subsystem 222, which may be embodied as circuitry and/or components to facilitate input/output operations with the processor 220, the memory 224, and other components of the monitoring unit 102. For example, the I/O subsystem 222 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

The data storage device 226 may be embodied as any type of device or devices configured for short-term or long-term storage of data such as, for example, memory devices and circuits, memory cards, hard disk drives, solid-state drives, or other data storage devices. As described further below, the data storage device 226 may store sensor data, generated data, and/or identification data related to the distribution transformer 106.

As shown, the monitoring unit 102 further includes one or more voltage/current sensors 228 and multiple fluid sensors 230. The voltage/current sensors 228 may be embodied as any electronic sensors capable of determining electrical current and voltage. As shown, the voltage/current sensors 228 are coupled to the voltage/current sensor connection 116, which is connected to the low-voltage bushings 112 of the distribution transformer 106. Thus, the voltage/current sensors 228 may sense the voltage and current of the low-voltage output of the distribution transformer 106. The voltage/current sensors 228 and/or the voltage/current sensor connection 116 may include one or more Hall effect sensors, current transformers, Rogowski coils, or other sensor devices. Illustratively, the voltage/current sensor connection 116 includes three Rogowski coils which are configured to measure current in each of three electrical phases of the distribution transformer 106. In some embodiments, the current measurement device may be included inside the transformer tank, insulated in epoxy resin, or embedded in the transformer bushings 112. The voltage/current sensor connection 116 also draws power from the low-voltage bushings 112, which may be used to power the functionality of the monitoring unit 102 and the communication unit 104. Additionally or alternatively, in some embodiments the monitoring unit 102 may draw power from any other terminal(s) of the distribution transformer 106.

Each of the fluid sensors 230 may be embodied as any electronic sensor capable of sensing one or more characteristics of the insulating fluid 110 within the distribution transformer 106. Each fluid sensor 230 is coupled to a sensor probe 232, which are arranged into the sensor probe array 114 on the exterior of the monitoring unit 102 and extend into the insulating fluid 110.

In at least one embodiment, the fluid sensors 230 may include a fluid temperature sensor, a moisture sensor, a dissolved gas sensor, an insulating fluid level sensor, and/or a pressure sensor. The fluid temperature sensor may be configured to determine the temperature of the insulating fluid 110, and may be positioned toward the top of the transformer tank. The fluid temperature sensor may be embodied as a sensor provided by ifm electronic GmbH, part number TA2115. The moisture sensor may be configured to detect the presence of water within the insulating fluid 110. The moisture sensor may be embodied as a sensor provided by ifm electronic GmbH, part number LDH100. The dissolved gas sensor may be configured as a sensor to detect one or more gases, such as hydrogen ($H_2$) dissolved in the insulating fluid 110. The dissolved gas sensor may be embodied as a hydrogen sensor provided by H2Scan, part number 440-GG01. The fluid level sensor may be configured to determine whether the insulating fluid 110 reaches a particular level in the tank. The monitoring unit 102 may include multiple fluid level sensors (e.g., a normal level sensor and a critical level sensor). Each insulating fluid level sensor may be embodied as a sensor provided by ifm electronic GmbH, part number LMT110. The pressure sensor may be configured to measure the pressure of the insulating fluid 110 within the distribution transformer 106. The pressure sensor may be embodied as a sensor provided by ifm electronic GmbH, part number PT5415.

As shown, the monitoring unit 102 is coupled to the communication unit 104, for example via a four-pin connector. The communication unit 104 includes an enclosure that allows for the transmission of radio waves or other wireless signals, such as a nonmetallic enclosure. As described further below, the communication unit 104 may be attached to the distribution transformer 106 outside of any metallic enclosure. As shown, the communication unit 104 includes a communication subsystem 234, location circuitry 236, and a radio frequency identification (RFID) subsystem 238. The communication subsystem 234 of the communication unit 104 may be embodied as any communication circuit, device, or collection thereof, capable of enabling communications between the communication unit 104 and/or other remote devices over a network or other communication topology. The communication subsystem 234 may be configured to use any one or more communication technology (e.g., wired or wireless communications) and associated protocols (e.g., Ethernet, Bluetooth®, Wi-Fi®, WiMAX, etc.) to effect such communication.

The location circuitry 236 of the communication unit 104 may be embodied as any type of circuit capable of determining the precise or approximate position of the distribution transformer 106. For example, the location circuitry 236 may be embodied as a global positioning system (GPS) receiver, capable of determining the precise coordinates of the distribution transformer 106. In other embodiments, the location circuitry 236 may triangulate or trilaterate the position of the distribution transformer 106 using distances or angles to cellular network towers with known positions, provided by the communication subsystem 234 or hotspot. In other embodiments, the location circuitry 236 may determine the approximate position of the distribution transformer 106 based on association to wireless networks with known positions, using the communication subsystem 234.

The RFID subsystem 238 may include one or more RFID tags or near-field communication (NFC) devices capable of being interrogated by nearby RFID/NFC antennas. The RFID subsystem 238 may allow a remote device to retrieve identification information when placed nearby the communication unit 104. Similarly, the RFID subsystem 238 may also include one or more RFID/NFC antennas to interrogate nearby devices, such nearby RFID identification cards. The RFID subsystem 238 may be capable of communicating even when the system 100 is disconnected from power (i.e., when the system 100 is stored in a warehouse or otherwise offline).

As discussed in more detail below, the monitoring unit 102, via the communication unit 104, may be configured to transmit and receive data with one or more remote devices over a network. The network may be embodied as any number of various wired and/or wireless networks. For example, the network may be embodied as, or otherwise include, a wired or wireless local area network (LAN), a wired or wireless wide area network (WAN), a cellular network, and/or a publicly-accessible, global network such as the Internet. As such, the network may include any number of additional devices, such as additional computers, routers, and switches, to facilitate communications between the system 100 and remote devices.

Referring now to FIGS. 3-7, one potential embodiment of the monitoring unit 102 is shown. The monitoring unit 102 is a compact device that includes all sensors and electronics within a single enclosure that is small enough to be attached to the distribution transformer 106. As shown, the enclosure of the illustrative monitoring unit 102 is formed from two parts, an electronics pod 302 and a sensor pod 304. The monitoring unit 102 is mechanically fastened with bolts to a flange 306, which is welded to the transformer tank wall 108 (or in some embodiments to a cover of the distribution transformer 106). As shown, the sensor probes 232 extend from the sensor pod 304 through the flange 306 into the insulating fluid 110. The flange 306 provides mechanical support to the monitoring unit 102 and avoids oil leaks from the distribution transformer 106. The flange 306 includes holes for installation with bolts and a groove/gasket system to avoid oil leaks.

Figure 5:
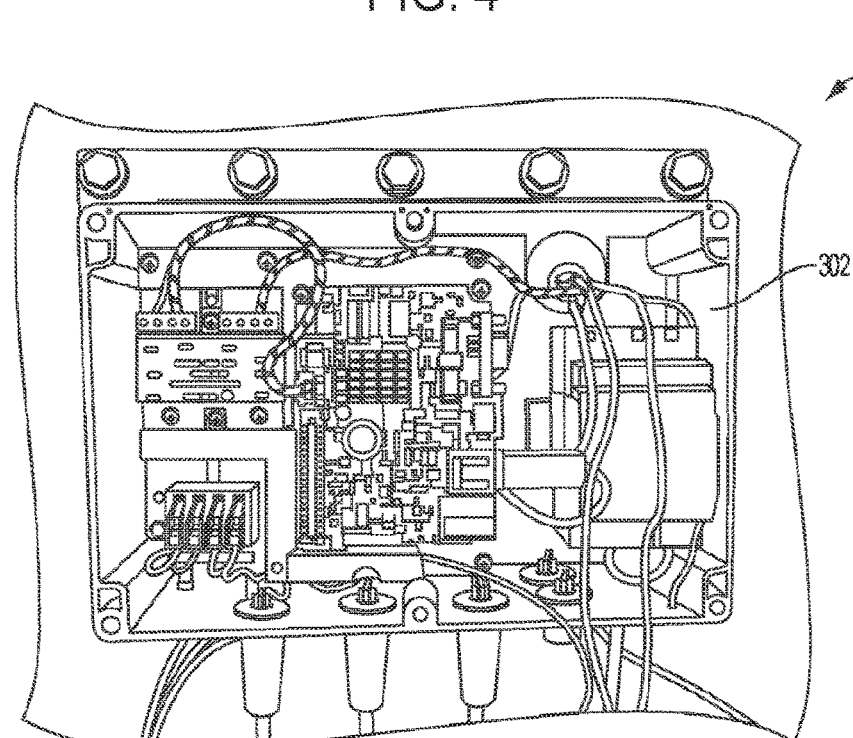
FIG. 5 is an interior view of at least one embodiment of the monitoring unit of FIGS. 1-4.

As best shown in FIG. 5, the electronics pod 302 includes electronic components of the monitoring unit 102 for data acquisition, execution, and storage, including the processor 220, the I/O subsystem 222, the memory 224, and the data storage device 226. The electronics pod 302 also includes electronics for current and voltage measurement, including the voltage/current sensors 228. The voltage/current sensor connection 116 may connect to ports in the electronics pod 302. The electronics pod 302 may also include connectors for the communication unit 104. In some embodiments, the electronics pod 302 may also include a connector for an external power supply.

Figure 6:
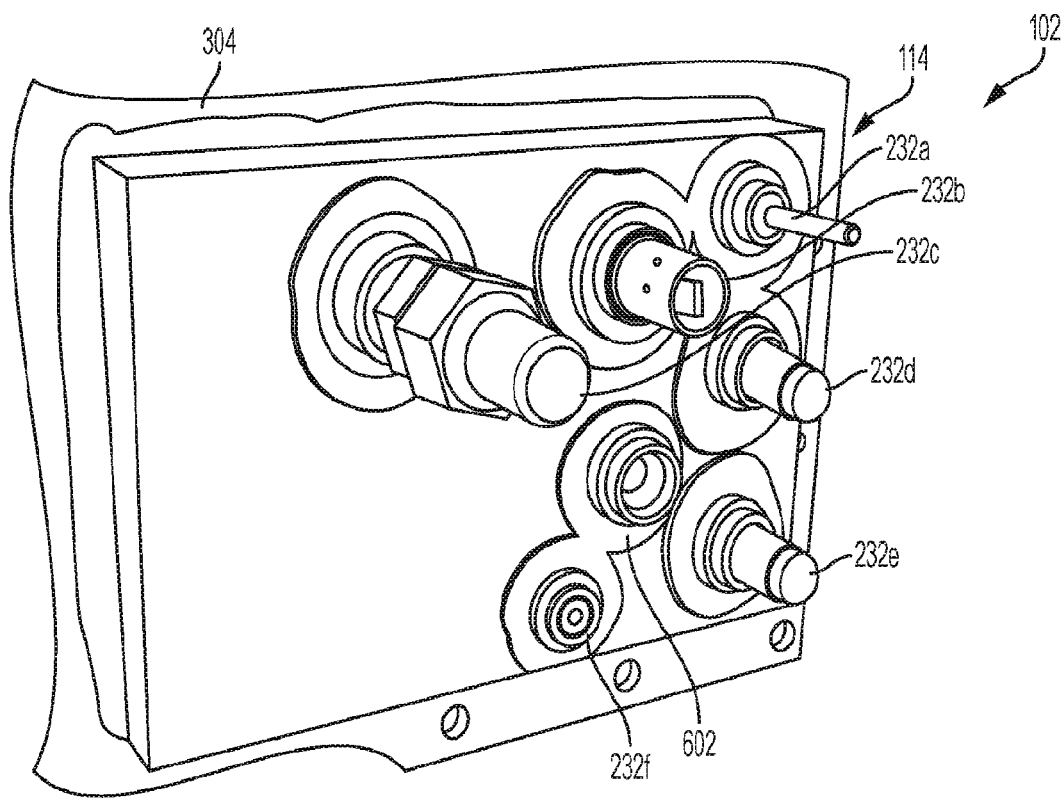
FIG. 6 is a detail view of a sensor probe array of the monitoring unit of FIGS. 1-5.
Figure 7:
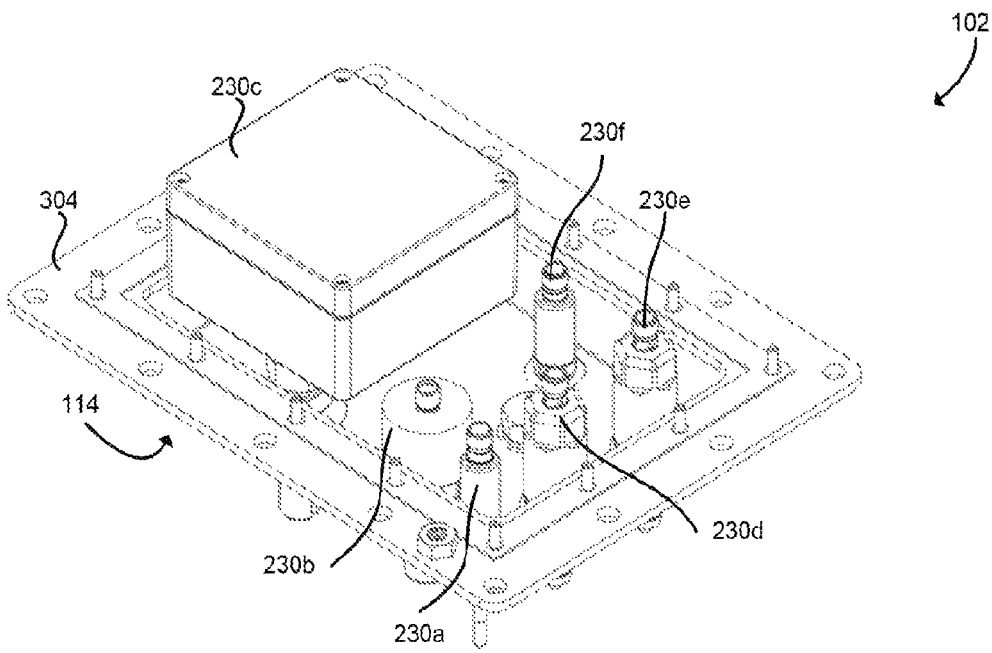
FIG. 7 is an interior view of a lower part of the monitoring unit of FIGS. 1-5.

As best shown in FIGS. 6 and 7, the sensor pod 304 includes the fluid sensors 230. The fluid sensors 230 may be connected to components of the electronics pod (e.g., the I/O subsystem 222 or the processor 220) via an internal passage between the electronics pod 302 and the sensor pod 304. As shown, the sensor probe array 114 (including multiple sensor probes 232) extends from the sensor pod 304. The illustrative probe array 114 includes a top fluid temperature sensor probe 232a, a moisture sensor probe 232b, a hydrogen sensor probe 232c, a normal insulating fluid level sensor probe 232d, a critical insulating fluid level sensor probe 232e, and a pressure sensor probe 232f. The sensor probes 232 are each connected to the corresponding temperature sensor 230a, moisture sensor 230b, hydrogen sensor 230c, insulating fluid level sensor 230d, insulating fluid level sensor 230e, and pressure sensor 230f, respectively, as best shown in FIG. 7. The sensor pod 304 also includes a coupling 602 that may be used as an alternative position for an insulating fluid level sensor. In other embodiments, the sensor pod 304 may include a different number or type of sensors 230. For example, the sensor pod 304 may not include the insulating fluid level sensors or the pressure sensor (e.g., for distribution transformers 106 equipped with an oil conservator). In those embodiments, the sensor pod 304 may include connectors for external insulating fluid level sensors. As another example, the sensor pod 304 may not include a hydrogen sensor, based on customer specification. Additionally, although illustrated as including a separate electronics pod 302 and sensor pod 304, it should be understood that in some embodiments all components of the monitoring unit 102 may be included in a single enclosure.

Figure 8:
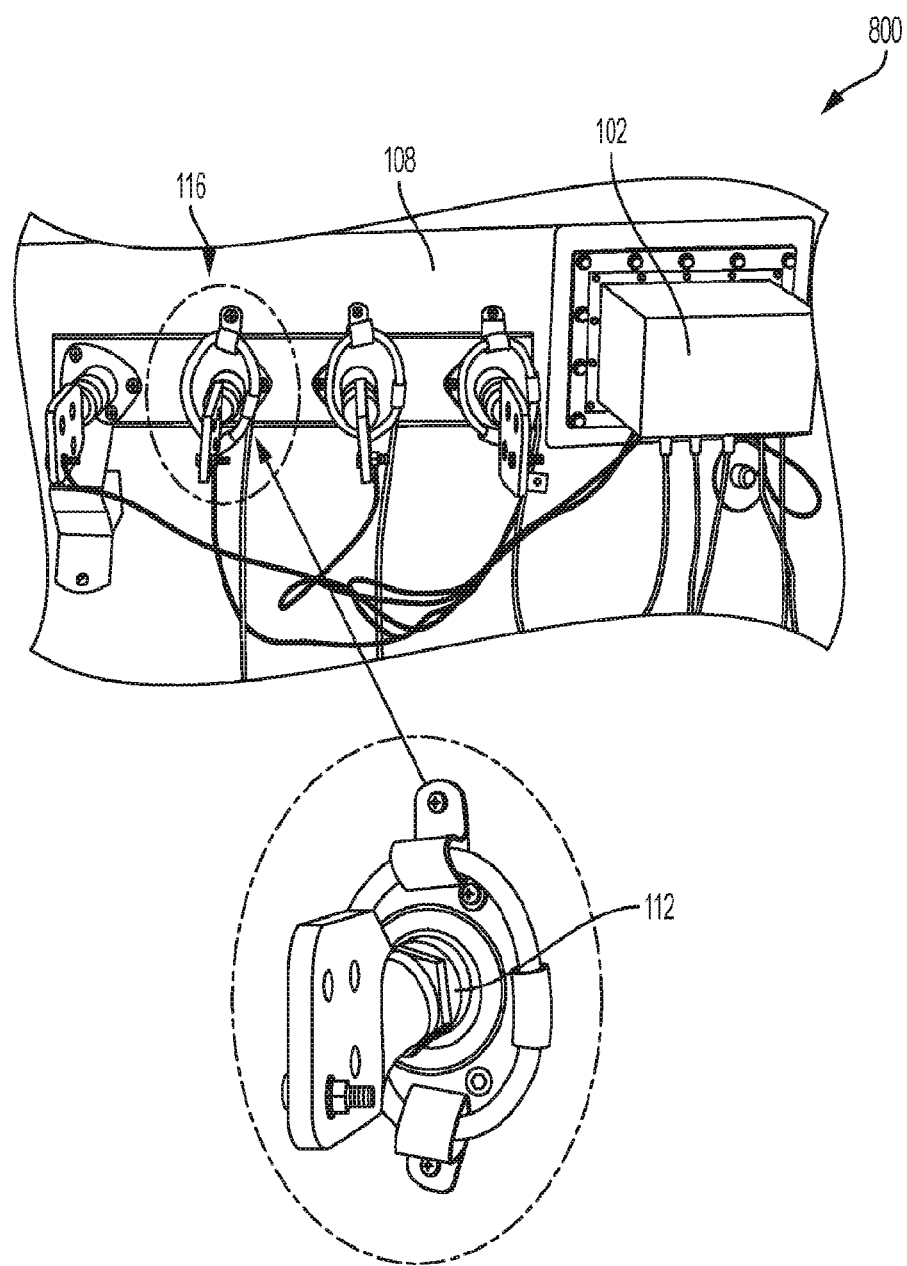
FIG. 8 is a detail view of a voltage/current sensor connection of the system of FIG. 1.
Figure 9:
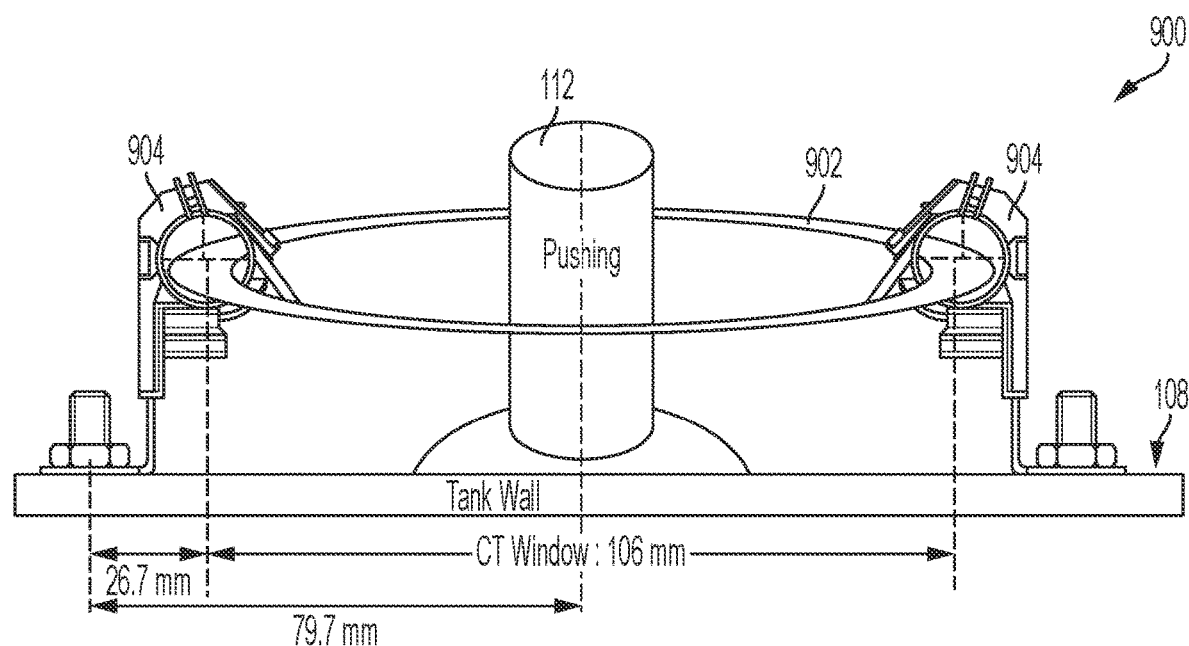
FIG. 9 is a side view of a voltage/current sensor connection of FIG. 8.

Referring now to FIGS. 8 and 9, the voltage/current sensor connection 116 of the system 100 is shown. As shown in diagram 800 of FIG. 8, the monitoring unit 102 is connected to the low-voltage bushings 112 of the distribution transformer 106. As shown, the monitoring unit 102 is attached to the tank wall 108, and the bushings 112 extend outward through the tank wall 108. For voltage measurement, wires are attached to the bushings 112 using standard terminal rings. As shown in diagram 900 of FIG. 9, for current measurement, a Rogowski coil 902 surrounds each bushing 112. Each Rogowski coil 902 is held in position using a pair of ratchet clamps 904.

Figure 10:
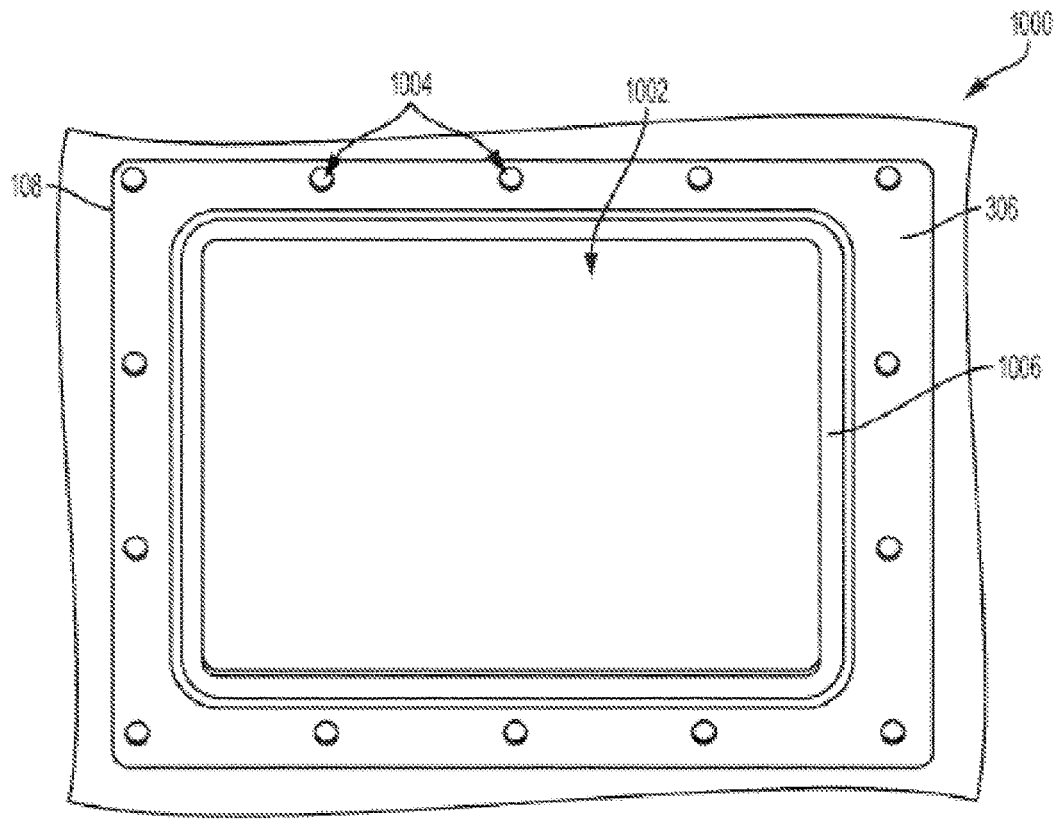
FIG. 10 is a front view of an opening in a transformer tank wall of the system of FIG. 1.

Referring now to FIG. 10, diagram 1000 illustrates an opening 1002 in the tank wall 108 of the distribution transformer 106. The opening 1002 is surrounded by the flange 306, which is welded to the tank wall 108. The flange includes multiple threaded holes 1004 which may receive bolts or other mounting hardware. During assembly, the sensor probe array 114 of the monitoring unit 102 may be inserted into the opening 1002, and the monitoring unit 102 (e.g., the sensor pod 304 of the monitoring unit 102) may be attached to the flange 306 with bolts. An o-ring 1006 is positioned in the flange 306 to prevent leaks.

Figure 11:
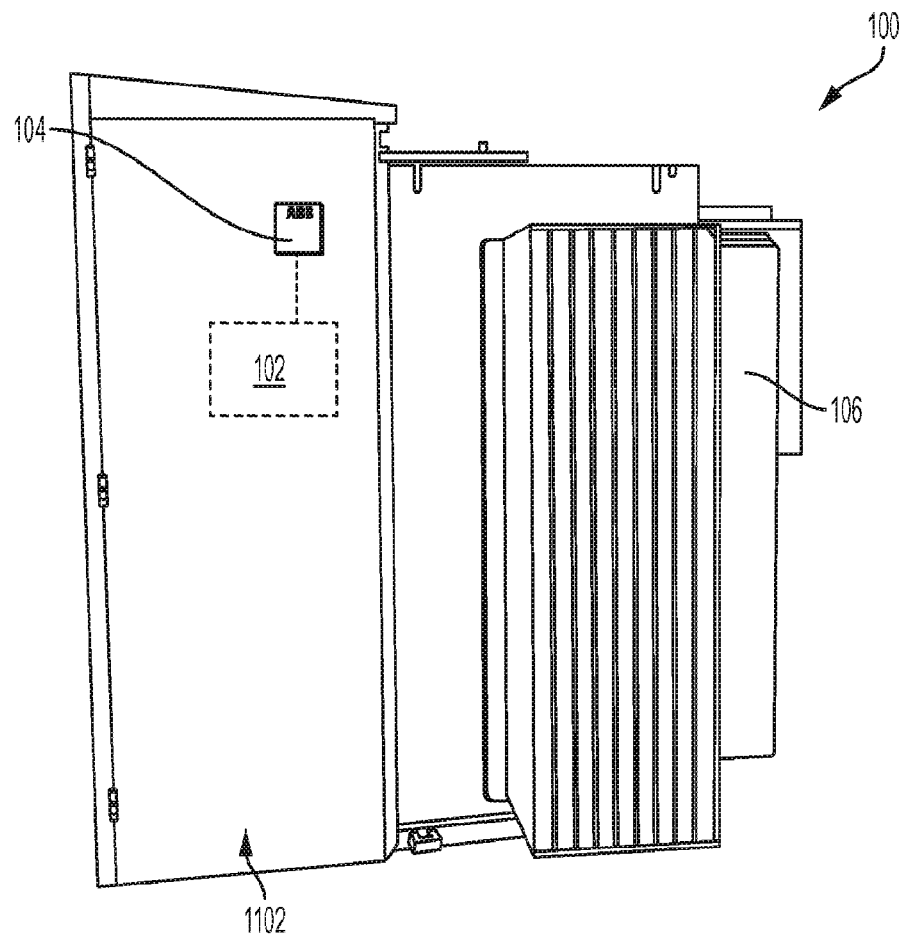
FIG. 11 is a perspective view of at least one embodiment of the system of FIG. 1.
Figure 12:
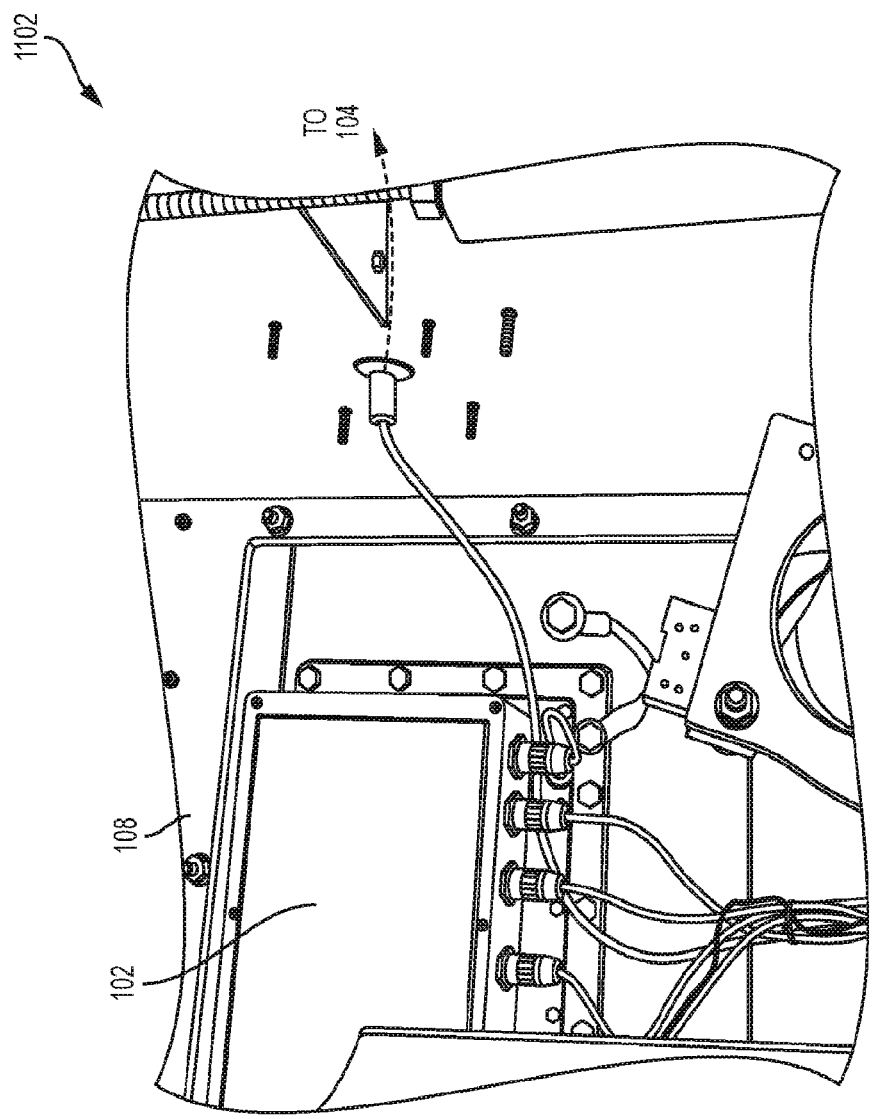
FIG. 12 is an interior view of at least one embodiment of the system of FIG. 11.

Referring now to FIGS. 11 and 12, one potential embodiment of the system 100 is shown. The illustrative system 100 includes a pad-mounted distribution transformer 106 that includes a lockable cabinet 1102. As shown, the communication unit 104 is attached to the outside of the distribution transformer 106 and the monitoring unit 102 is positioned inside the cabinet 1102, and is therefore inside the distribution transformer 106. The cabinet may be lockable or otherwise physically secure, and the communication unit 104 may be connected using a tamper-proof system for physical protection. For example, bolts attaching the communication unit 104 to the distribution transformer 106 may be accessible only from within the cabinet 1102. As shown, a physical wire (e.g., a four-pin/four-wire connector) allows communication between the monitoring unit 102 and the communication unit 104. Because the distribution transformer 106 has a metallic enclosure, positioning the communication unit 104 on the outside of the distribution transformer 106 may allow for improved wireless communication reception as compared to being positioned inside the cabinet of the distribution transformer 106 with the monitoring unit 102. Additionally, by being positioned on the outside of the distribution transformer 106 in an accessible position, the communication unit 104 may be used more easily with RFID scanners or other near-field communication (NFC) tools.

Figure 13:
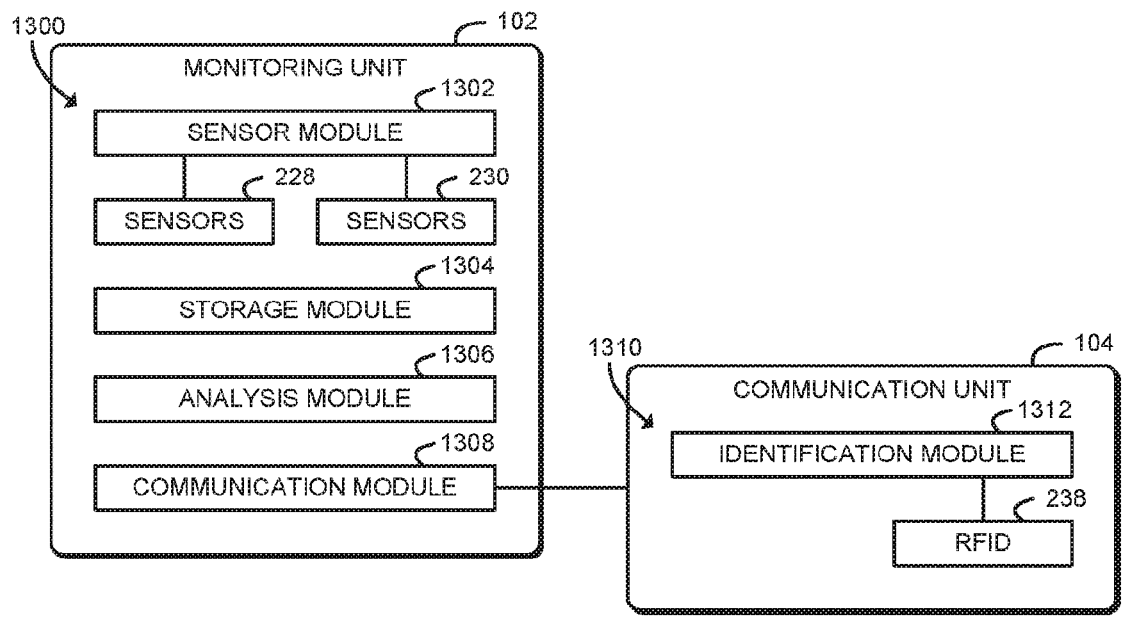
FIG. 13 is a simplified block diagram of at least one embodiment of an environment that may be established by the monitoring unit of FIGS. 1-12.

Referring now to FIG. 13, in an illustrative embodiment, the monitoring unit 102 establishes an environment 1300 during operation. The illustrative environment 1300 includes a sensor module 1302, a storage module 1304, an analysis module 1306, and a communication module 1308. The various modules of the environment 1300 may be embodied as hardware, firmware, software, or a combination thereof. For example the various modules, logic, and other components of the environment 1300 may form a portion of, or otherwise be established by, the processor 220 or other hardware components of the monitoring unit 102. As such, in some embodiments, any one or more of the modules of the environment 1300 may be embodied as a circuit or collection of electrical devices (e.g., sensor circuitry 1302, storage circuitry 1304, analysis circuitry 1306, and/or communication circuitry 1308). Additionally, in some embodiments, one or more of the illustrative components may form a portion of another component and/or one or more of the illustrative components may be independent of one another.

The sensor module 1302 is configured to receive sensor data from sensors 228, 230 of the monitoring unit 102. The sensor data may include voltage or current data from one or more voltage or current sensors 228. The voltage or current data is indicative of voltage or current output by the distribution transformer 106. The sensor data may also include fluid tank data from one or more fluid sensors 230. The fluid tank data is indicative of a characteristic within the distribution transformer 106 fluid tank. The fluid sensor 230 may be embodied as, for example, a fluid temperature sensor, an insulating fluid level sensor, a pressure sensor, a water content sensor, or a dissolved gas sensor. The voltage or current sensor 228 may be coupled to a transformer terminal of the distribution transformer 106 to measure the voltage or current output by the distribution transformer 106. The monitoring unit 102 may be powered by the transformer terminal.

The storage module 1304 is configured to store the sensor data in an internal data storage device of the monitoring unit 102. The analysis module 1306 is configured to analyze the sensor data to determine generated data. The generated data may be embodied as, for example, estimated lifetime consumption data or diagnostics data.

The communication module 1308 is configured to communicate the sensor data or the generated data to a remote computing device. The sensor data or the generated data may be communicated with the remote computing device using the communication unit 104. The communication module 1308 may be configured to communicate alerts to the remote computing device based on the sensor data or the generated data.

Still referring to FIG. 13, in an illustrative embodiment, the communication unit 104 may establish an environment 1310 during operation. The illustrative environment 1310 includes an identification module 1312, which may be embodied as hardware, firmware, software, or a combination thereof. For example the various modules, logic, and other components of the environment 1310 may form a portion of, or otherwise be established by, the communication subsystem 234, the RFID subsystem 238, or other hardware components of the communication unit 104. As such, in some embodiments, any one or more of the modules of the environment 1310 may be embodied as a circuit or collection of electrical devices (e.g., identification circuitry 1312).

The identification module 1312 is configured to transmit identification data indicative of the distribution transformer 106 to a remote computing device. The identification data may be transmitted to the remote computing device using the RFID subsystem 238 of the communication unit 104.

Figure 14:
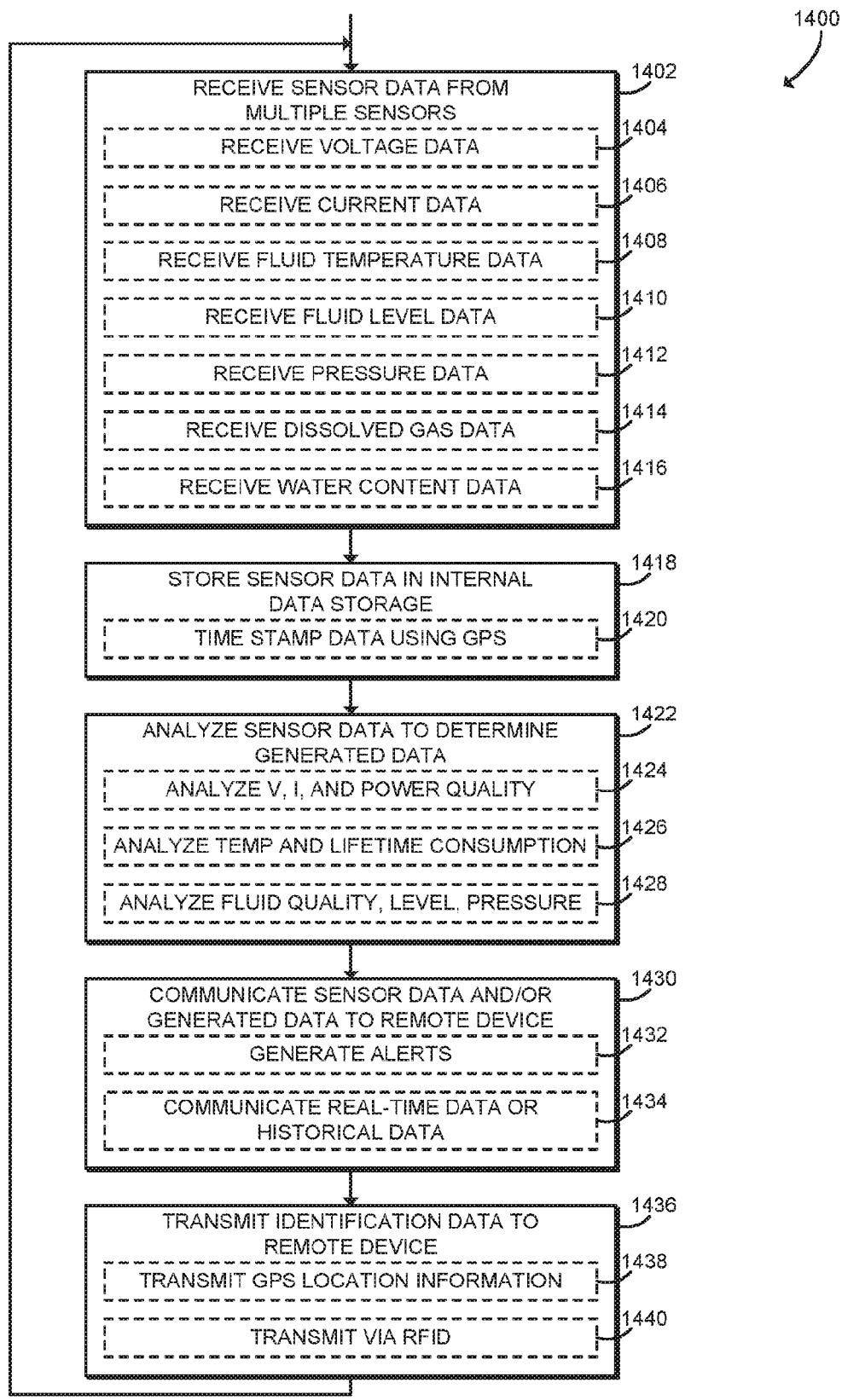
FIG. 14 is a simplified flow diagram of at least one embodiment of a method for distribution transformer monitoring that may be executed by the monitoring unit of FIGS. 1-13.

Referring now to FIG. 14, in use, the monitoring unit 102 may execute a method 1400 for distribution transformer monitoring. The steps of method 1400 are illustrative, and it will be appreciated that, in other embodiments, the monitoring unit 102 may execute a method for distribution transformer monitoring that includes additional or different steps from those shown in FIG. 14 and/or does not include all of the steps shown in FIG. 14.

The method 1400 begins with block 1402, in which the monitoring unit 102 receives sensor data from multiple sensors 228, 230. The monitoring unit 102 may continually monitor the sensors 228, 230 while the distribution transformer 106 is in operation. In block 1404, the monitoring unit 102 receives voltage data from the voltage/current sensors 228. In block 1406, the monitoring unit 102 receives current data from the voltage/current sensors 228. In block 1408, the monitoring unit 102 receives fluid temperature data from the fluid sensors 230. In block 1410, the monitoring unit 102 receives fluid level data from the fluid sensors 230. In block 1412, the monitoring unit 102 receives pressure data from the fluid sensors 230. In block 1414, the monitoring unit 102 receives dissolved gas data from the fluid sensors 230. In block 1416, the monitoring unit 102 receives water content data from the fluid sensors 230.

In block 1418, the monitoring unit 102 stores the sensor data in an internal data storage device 226, such as a flash memory card. The monitoring unit 102 may include sufficient storage space to store sensor data for the entire expected service life of the distribution transformer 106 (e.g., 20 years). Thus, the data storage device 226 may include historical sensor data for the entire service life of the distribution transformer 106. In some embodiments, in block 1420 the monitoring unit 102 may time-stamp the sensor data using the GPS receiver 236 as a time reference.

In block 1422, the monitoring unit 102 analyzes the raw sensor data to determine one or more types of generated data. The monitoring unit 102 may execute one or more algorithms to determine the generated data, which may include composite or other calculated data that is useful to the customer such as estimated lifetime consumption data, diagnostics data, or other data. For example, the monitoring unit 102 may determine a consumed lifetime estimate (e.g., an estimate of consumed hours) based on an estimated hottest spot temperature and the amount of current output to the load. As another example, the monitoring unit 102 may forecast transformer aging based on outside environment temperature. The consumed lifetime may be estimated/forecast for the next week based on historic hourly, daily, weekly, and monthly values of ambient temperatures and current/loading. As another example, the monitoring unit 102 may compute a K-factor or harmonic loss factor in real time at intervals during operation, and if the harmonics exceed the rated K-factor threshold, a warning may be given. As another example, the monitoring unit 102 may compute the K-factor at intervals in real time and use the K-factor to de-rate the overall current rating of the transformer. The new current rating may be used to compute an updated estimate of the consumed lifetime. Those calculations may be determined using applicable IEEE/IEC standards or publications. As another example, the monitoring unit 102 may estimate hot spot temperature based on both ambient and top fluid temperature, check if the harmonic content is above a rated threshold and, if so, compare the estimate of the hot spot temperature from ambient and top fluid temperature. If those estimated temperatures do not match within 3-5 degrees, the monitoring unit 102 may generate a warning. As another example, the monitoring unit 102 may determine +/− limits of measurements that contribute to the aging factor estimate and then estimate the aging factor with the bottom uncertainty limit and the upper uncertainty limit and then provide the upper and lower consumed lifetime limits. In some embodiments, the monitoring unit 102 may update the age estimate after a power outage depending on the length of the outage.

In some embodiments, in block 1424 the monitoring unit 102 may analyze voltage, current, and power quality. For example, the monitoring unit 102 may analyze current data to provide information on load on the distribution transformer 106 and (in conjunction with temperature), the margin of overload ability. The monitoring unit 102 may also analyze the harmonic content of the current as well as any unbalance of the current among the phases. The monitoring unit 102 may analyze voltage information to determine, for example, the correctness of the voltage value compared to the value allowed by standard or if an action for tap changer regulation is required. The monitoring unit 102 may use the voltage information to determine outage information on the transformer secondary winding, for example, to determine if something has happened to the fuse integrated in the distribution transformer 106. The monitoring unit 102 may also determine the harmonic content of the voltage. In some embodiments, the monitoring unit 102 may also analyze total power delivery data. When compared with power consumption data for the consumers (e.g., residences) served by the distribution transformer 106, the total power delivery data may reveal non-technical losses (e.g., utility theft) or other energy losses.

In some embodiments, in block 1426 the monitoring unit 102 may analyze temperatures and lifetime consumption data. The monitoring unit 102 may check the actual temperature of the distribution transformer 106 (i.e., the fluid temperature) in conjunction with current and environmental conditions, which may provide information for overload ability. The monitoring unit 102 may generate alerts for abnormal or critical fluid temperature. In some embodiments, the monitoring unit 102 may monitor for the presence of water inside the fluid, which may reduce significantly the expected lifetime of the distribution transformer 106. A high level of water may be extremely harmful and may suggest immediate maintenance action. The monitoring unit 102 may generate alerts for abnormal or critical water in fluid amounts.

In some embodiments, in block 1428, the monitoring unit 102 may analyze fluid quality, fluid level, and/or tank pressure. For example, the monitoring unit 102 may check the quantity of fluid present in the transformer and avoid leaving an active part without insulating fluid. The monitoring unit 102 may generate alerts for abnormal or critical fluid levels. The monitoring unit 102 may monitor pressure inside the distribution transformer 106, which is a relevant parameter to determine an internal fault condition. The monitoring unit 102 may generate alerts for abnormal or critical fluid or gas space pressures. The monitoring unit 102 may determine whether dissolved gases (e.g., hydrogen gas) are present in the fluid. The presence of dissolved gas may indicate aging, excessive temperature, or dielectric issues in some part of the distribution transformer 106. The monitoring unit 102 may generate alerts for abnormal or critical dissolved gas levels. Although illustrated as monitoring dissolved hydrogen ($H_2$), it should be understood that in other embodiments the monitoring unit 102 may monitor one or more other types of dissolved gases, including oxygen ($O_2$), nitrogen ($N_2$), carbon monoxide (CO), carbon dioxide ($CO_2$), methane ($CH_4$), ethane ($C_2H_6$), ethylene ($C_2H_2$), acetylene ($C_2H_2$), propane ($C_3H_8$), propylene ($C_3H_6$), or other gases.

It should be understood that the monitoring unit 102 may monitor and analyze other sensor data that may indicate the internal conditions or other status of the distribution transformer 106. For example, the monitoring unit 102 may monitor and analyze sound emission and/or vibration produced by the distribution transformer 106. The monitoring unit 102 may also collect data relating to the status of one or more protection fuses.

Figure 16:
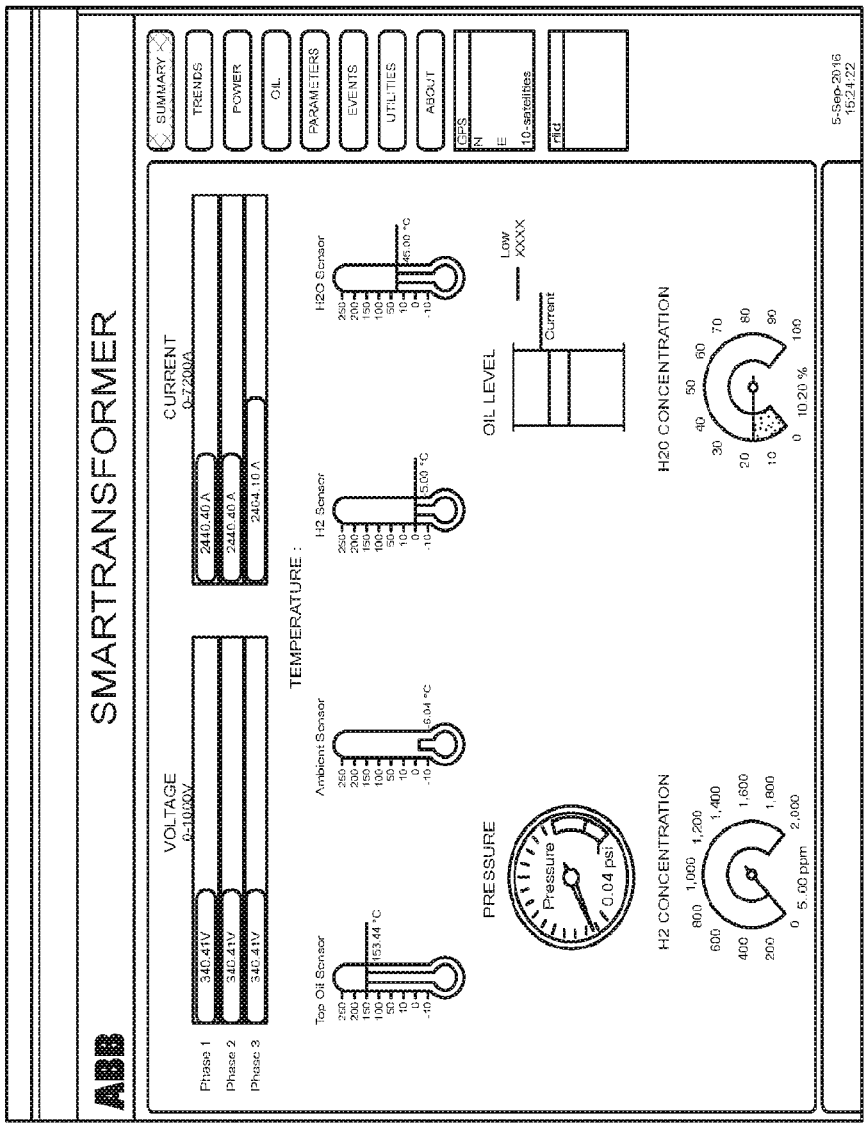
FIG. 16 is an illustrative embodiment of a first user interface screen of a configuration tool for the system of FIG. 1.
Figure 17:
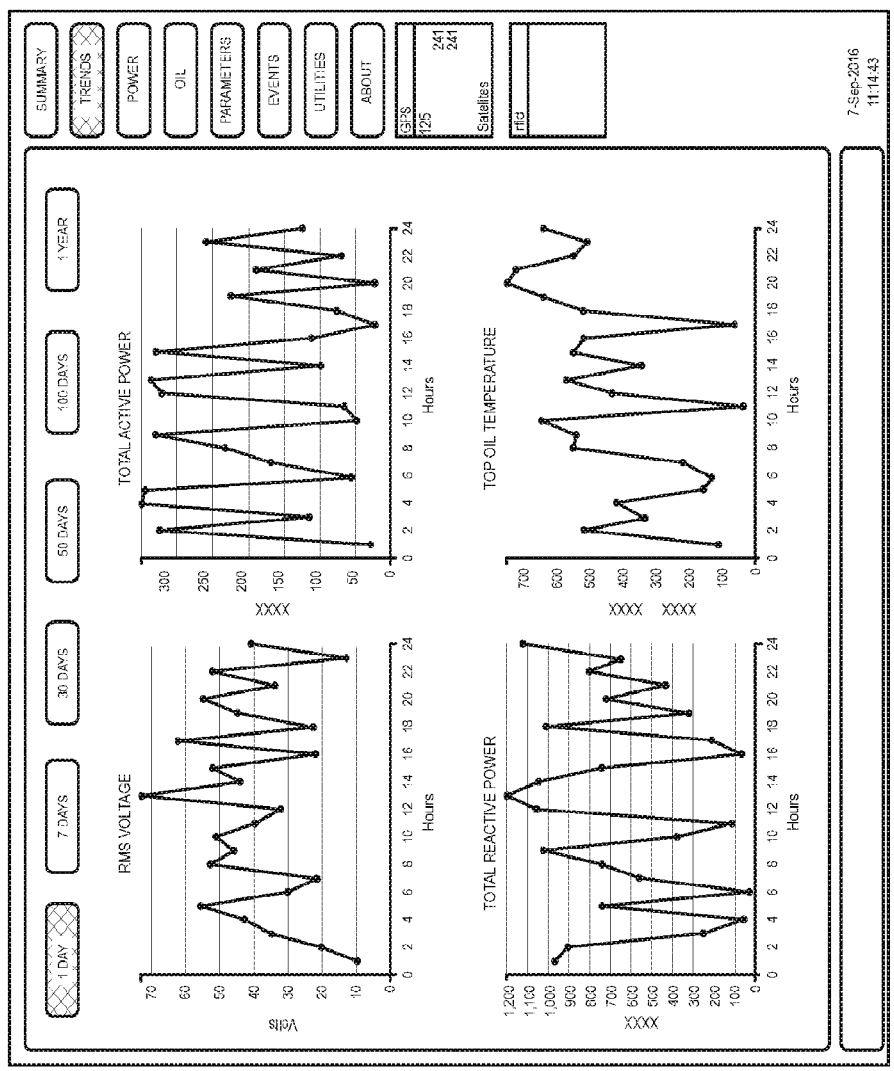
FIG. 17 is an illustrative embodiment of a second user interface screen of the configuration tool of FIG. 15.

In block 1430, the monitoring unit 102, using the communication unit 104, communications the sensor data and/or the generated data to a remote device. The monitoring unit 102 may communicate information such as, for example, configuration data, copyright data, transformer nameplate information, insulation fluid parameters, the configuration of analytics, events, and diagnostic algorithms, real-time information on the sensor measurements, historical trends of sensor measurements (e.g., with graphical display), transformer events, network events, and/or other data. The communication unit 104 may communicate the data wirelessly (e.g., via Wi-Fi wireless networking, Bluetooth, or other wireless communication protocol) or with a wired network connection. The remote device may be embodied as any computer, server, tablet, smartphone, mobile computing device, or other device capable of accessing data generated by the monitoring unit 102. For example, the remote device may be part of or otherwise in communication with a utility customer's supervisory control and data acquisition (SCADA) system or network communication center (NCC). In some embodiments, the remote device may execute one or more user interface applications configured to access the data collected and/or generated by the monitoring unit 102. Illustrative embodiments of user interface screens of one such application are shown in FIGS. 16 and 17. In some embodiments, to secure access to the monitoring unit 102, an encoded RFID card must be passed physically close to the RFID subsystem 238 of the communication unit 104 in order to allow access to the wireless networking features of the communication unit 104.

In some embodiments, in block 1432, the monitoring unit 102 may generate one or more alerts, alarms, warnings, or other notifications based on the sensor data or the generated data. In some embodiments, the monitoring unit 102 may control an external load break switch to open and close according to the values of sensor data and/or generated data. In some embodiments, the monitoring unit 102 may not perform actuation itself, but may serve as a trigger for a user protection system (e.g., in the substation or subsystem). In some embodiments, in block 1434 the monitoring unit 102 may communicate real-time data or historical data.

In block 1436, the monitoring unit 102 and/or the communication unit 104 may transmit identification data to a remote device. The identification data may include any data related to the identification, attributes, qualification, or other attributes of the distribution transformer 106. For example, the identification information may include rating plate information, test reports, drawings, instructions, and other data. In some embodiments, in block 1438 the communication unit 104 may transmit GPS location information to the remote device. For example, location information may be made available to a network control station, allowing the distribution transformer 106 to be easily located by a maintenance crew in the case of faults or feeders overload. In some embodiments, in block 1440, the communication unit 104 may transmit identification data via the RFID subsystem 238. Note that the RFID subsystem 238 may transmit data even when the other components of the monitoring unit 102 and the communication unit 104 are not powered. Thus, the RFID subsystem 238 may be used for identifying the distribution transformer 106 both in the field and offline (e.g., while stored in a warehouse).

Figure 15:
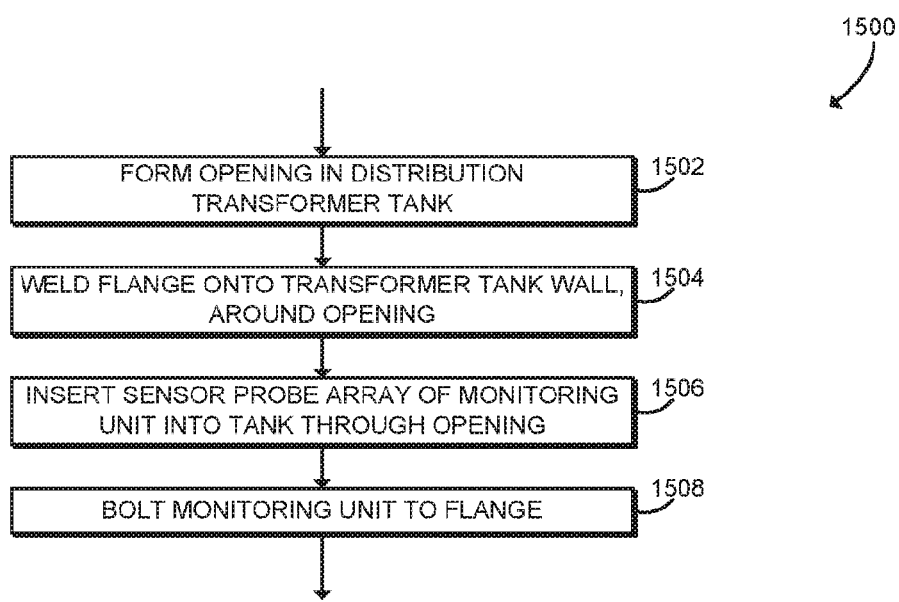
FIG. 15 is a simplified flow diagram of at least one embodiment of a method for assembling the system of FIG. 1.

Referring now to FIG. 15, a method 1500 for assembling a system for distribution transformer monitoring is shown. The method 1500 begins with block 1502, in which an opening is formed in the tank of the distribution transformer 106. For example, an opening 1002 may be formed in the tank wall 108 as shown in FIG. 10. The opening may be cut into an existing tank wall 108, or the tank may be originally manufactured with the opening. Thus, in some embodiments, an existing distribution transformer 106 may be retrofit with the monitoring unit 102.

In block 1504, a flange 306 is welded on the transformer tank wall 108, surrounding the opening. As described above, the flange 306 is configured to attach to the monitoring unit 102 (e.g., the sensor pod 304 of the monitoring unit 102), for example by including appropriate threaded holes to receive mounting bolts. In block 1506, the sensor probe array 114 of a monitoring unit 102 is inserted into the tank of the distribution transformer 106 through the opening. In block 1508, the monitoring unit 102 (e.g., an assembly of the sensor pod 304 and the electronics pod 302) is bolted to the flange 306. After the monitoring unit 102 is attached to the flange 306, the method 1500 is complete. After completion of the method 1500, the monitoring unit 102 is ready to be connected to components outside of the tank, such as the low-voltage bushings 112 of the distribution transformer 106 and the communication unit 104.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, systems, and articles described herein. It will be noted that alternative embodiments of the methods, systems, and articles of the present disclosure may not include all of the features described yet still benefit from at least some of the advantages of such features. Those of ordinary skill in the art may readily devise their own implementations of the methods, systems, and articles that incorporate one or more of the features of the present disclosure.

What is claimed is:

1. A distribution transformer monitoring system, the distribution transformer monitoring system comprising:
    a distribution transformer that includes a transformer fluid tank;
    wherein the distribution transformer is communicatively coupled to a monitoring unit that comprises a plurality of sensors, a sensor module, a storage module, and an analysis module,
    wherein the plurality of sensors comprises a voltage/current sensor, a fluid sensor coupled to a sensor probe, wherein the sensor probe extends into the transformer fluid tank;
    wherein the sensor module is configured to receive sensor data from the plurality of sensors, wherein the sensor data comprises voltage/current data and fluid tank data;
    wherein the voltage/current data is received from the voltage/current sensor and is indicative of voltage/current data output by the distribution transformer,
    wherein fluid tank data is received from the sensor probe data via the fluid sensor,
    wherein the fluid tank data is indicative of a characteristic within the transformer fluid tank;
    the storage module to store the sensor data in an internal data storage device;
    wherein the analysis module is configured to analyze the sensor data to determine generated data comprising at least diagnostics data; and
    wherein the distribution transformer monitoring system is configured to communicate at least one of the sensor data the generated data to a remote computing device.

2. The system of claim 1, further comprising:
a communication unit comprising an enclosure separate from the monitoring unit; and
a communication module configured to communicate with the remote computing device.

3. The system of claim 1, further comprising:
a communication unit comprising an identification module to transmit identification data indicative of the distribution transformer to the remote computing device.

4. The system of claim 3, wherein to transmit the identification data indicative of the distribution transformer comprises to transmit the identification data with a radio frequency identifier (RFID) system of the communication unit.

5. The system of claim 1, wherein the fluid sensor comprises a fluid temperature sensor, an insulating fluid level sensor, a pressure sensor, a water content sensor, or a dissolved gas sensor.

6. The system of claim 1, wherein the generated data comprises estimated lifetime consumption data.

7. The system of claim 1, wherein a communication module is configured to communicate an alert to the remote computing device based on the sensor data or the generated data.

8. The system of claim 1, wherein:
the distribution transformer comprises a transformer terminal; and
the voltage/current sensor is coupled to the transformer terminal to measure a voltage/current output by the distribution transformer.

9. The system of claim 8, wherein the monitoring unit is powered by the transformer terminal.

10. A method for distribution transformer monitoring, the method comprising:
coupling a monitoring unit with a distribution transformer, wherein the distribution transformer comprises a transformer fluid tank, wherein the monitoring unit comprises a plurality of sensors, a sensor module, a storage module, an analysis module, a communication module and an internal data storage device, wherein the plurality of sensors comprises a voltage/current sensor, a fluid sensor and a sensor probe, wherein the fluid sensor is coupled with the sensor probe, wherein the sensor probe extends into the transformer fluid tank;
coupling a communication unit with the distribution transformer;
communicatively coupling the communication unit with the monitoring unit;
receiving, by the sensor module, sensor data from the plurality of sensors wherein the sensor data comprises voltage/current data and fluid tank data, wherein the voltage/current data is from the voltage/current sensor, wherein the voltage/current data is indicative of a voltage/current output by the distribution transformer, wherein the fluid tank data is from the fluid sensor via the sensor probe, wherein the fluid tank data is indicative of a characteristic within the transformer fluid tank;
storing, by the storage module, the sensor data in the internal data storage device;
analyzing, by analysis module, the sensor data to determine generated data, wherein the generated data comprises at least diagnostics data; and
communicating, by the communication module, the sensor data or the generated data to a remote computing device via the communication unit.

11. The method of claim 10, wherein the communication unit comprises an enclosure separate from the monitoring unit.

12. The method of claim 10, further comprising transmitting, by an identification module of the communication unit, identification data indicative of the distribution transformer to the remote computing device.

13. The method of claim 12, wherein transmitting the identification data indicative of the distribution transformer comprises transmitting the identification data with a radio frequency identifier (RFID) system of the communication unit.

14. The method of claim 10, wherein the fluid sensor comprises a fluid temperature sensor, an insulating fluid level sensor, a pressure sensor, a water content sensor, or a dissolved gas sensor.

15. The method of claim 10, wherein the generated data comprises estimated lifetime consumption data.

16. The method of claim 10, wherein the distribution transformer comprises a transformer terminal, wherein the monitoring unit is powered by the transformer terminal.

* * * * *